United States Patent [19]

Chen

[11] 4,139,906

[45] Feb. 13, 1979

[54] SWITCH FOR FAULT TOLERANT BUBBLE DOMAIN MEMORY SYSTEMS

[75] Inventor: Thomas T. Chen, Yorba Linda, Calif.

[73] Assignee: Rockwell International Corporation, El Segundo, Calif.

[21] Appl. No.: 856,718

[22] Filed: Dec. 1, 1977

[51] Int. Cl.² .................................................. G11C 19/08
[52] U.S. Cl. .......................................... 365/15; 365/1
[58] Field of Search ........................ 365/1, 15, 13, 16

[56] References Cited
U.S. PATENT DOCUMENTS 4,075,709  12/1978  Chen et al. ............................. 365/1

Primary Examiner—James W. Moffitt
Attorney, Agent, or Firm—H. Frederick Hamann; G. Donald Weber, Jr.

[57] ABSTRACT

There is provided an improved switching arrangement for controlling the interaction of magnetic bubble domain propagation loops in order to provide a large, serial storage loop which is fault tolerant and has improved operating characteristics. The switch provides on-chip correction capability and, as well, enhanced switching capability to render defective loops or propagation path portions separable in a positive manner.

6 Claims, 2 Drawing Figures

SWITCH FOR FAULT TOLERANT BUBBLE DOMAIN MEMORY SYSTEMS

The invention herein described was made in the course of or under a contract or subcontract thereunder, with the Air Force.

BACKGROUND OF THE INVENTION

1. Field of the Invention

This invention is directed to magnetic bubble domain memory systems, in general, and to an improved switch for use with fault tolerant magnetic bubble domain systems, in particular.

2. Prior Art

The magnetic bubble domain device has become well-recognized in the art. One of the major uses of magnetic bubble domain devices is in the information storage field. The amount of storage which can be provided is continuously being enlarged. This enlarged storage capability is established as a function of the number of devices on a wafer, the type of material, the period (size) of the bubbles, the devices and the like. However, when storage is increased on a wafer or chip, the attendant problems of yields are also affected. That is, with more devices on a chip, the chances of defects in a loop are increased. Consequently, the socalled "fault tolerant" capability of the chip is examined.

In order to provide a fault tolerant system, it is frequently found desirable to add a plurality of additional loops or propagation path portions which are redundant with other loops or path portions. In the event that there is a defect in one of the "original" portions, one of the "redundant" paths is included in the circuit. These paths or loops are included into the circuit in one of several ways. For example, an on-chip alteration or correction can be made. This on-chip correction is made by etching or scribing the chip such that a portion of the propagation path is removed whereby that portion is not included in the overall storage scheme. The correction can also be effected by alterations to a conductor loop when an active switch is used as is known in the art. Conversely, the correction can be effected in an off-chip manner by means of sophisticated driving electronics which can avoid switching information into defective loops (if an on-chip correction has not been utilized) and remembering these changes.

The problems with the known correction schemes are readily apparent. In the off-chip procedures noted above, the electronics is extremely sophisticated and complicated. In addition, the throughput data rate can be decreased significantly and the system is decreased in efficiency. Moreover, an external non-volatile memory is usually required.

As to the on-chip corrections, a correction in the propagation path, per se, is frequently tedious and difficult. An on-chip correction to the conductor loop is also tedious and difficult. In addition, the conductor correction is frequently found to be ineffective in preventing spurious signals or bubbles which are generated in the defective loop from being transferred into the information stream, even though no information is transferred from the information stream to the defective loop.

As is typical in any technology, improved operation is continuously sought. Less complicated control systems or fault tolerant systems are desired. Methods and apparatus for improving the throughput data rate and the error-free operation of these devices is also desired.

PRIOR ART STATEMENT

The most pertinent prior art known to applicant is listed herewith.

U.S. Pat. No. 3,990,058; Archer et al.; Multiple Loop Shift Register having Redundancy which describes an on-chip correction scheme wherein a portion of the secondary path, per se, is degraded.

U.S. Patent Application Ser. No. 688,651, filed May 21, 1976, entitled Data Processing Switch which is directed to a double switch design for data processing of a magnetic bubble domain memory chip.

SUMMARY OF THE INVENTION

This invention is directed to a switch which permits fault tolerant magnetic bubble domain systems to be produced with greater efficiency. The switch, in one condition, actively interconnects portions of two separate bubble paths and maintains the paths separate. In the other condition, the switch actively interconnects the portions of the two paths into a single, series connected, propagation path. In the second mentioned condition, information propagates through a single path. In the first mentioned condition, information propagates through the separate paths separately with no interaction (e.g. transfer or exchange) of magnetic bubble domains (information) between the separate paths.

DESCRIPTION OF A PREFERRED EMBODIMENT

Figure 1:
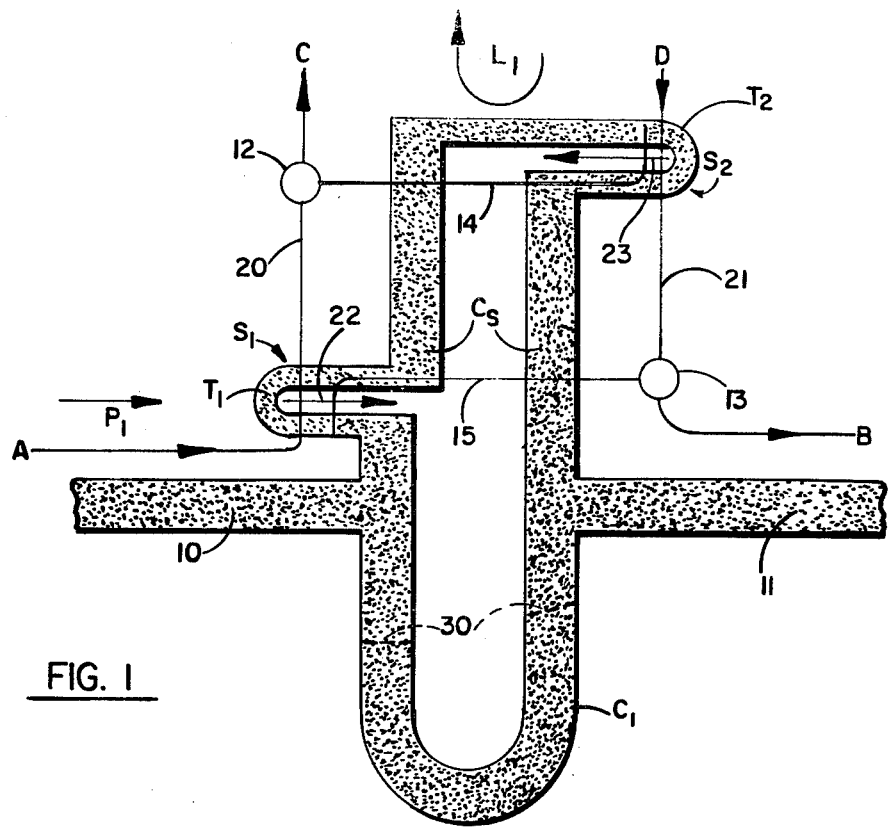
FIG. 1 is a diagramatic representation of a switch which specifically includes a conductor arrangement related to separate magnetic bubble domain propagation paths.

Referring now to FIG. 1, there is shown a detailed diagram of the switch of the subject invention. The switch which can be termed an antiexchange switch, is utilized with a magnetic bubble domain system. The system comprises a first propagation path 20 which extends from location A to location C. A second propagation path 21 extends from location D to location B. Another propagation path 14 extends from a location adjacent to path 21 to merge 12 wherein paths 14 and 20 are joined. Similarly, path 15 extends from a location adjacent to path 20 to merge 13 wherein paths 15 and 21 are joined. The propagation paths can be provided in virtually any known manner. For example, chevrons, assymetric chevrons, T-bars, gapless devices or the like, can be utilized to form the path elements.

Arrows 22 and 23, respectively, represent transfer devices such as, but not limited to, dollar sign ($) switches or the like which selectively transfer information (i.e. magnetic bubble domains) from path 20 to path 15 (arrow 22) or from path 21 to path 14 (arrow 23). A conductor is provided to control the operation of transfer devices 22 and 23. The conductor includes conductor portions 10 and 11 which can be considered to be portions of the basic conductor. Correction loop C1 is connected between conductors 10 and 11 to provide one conductive path therebetween. In addition, a further, complex loop CS is connected electrically in parallel with correction loop C1. Complex loop CS includes transfer loop T1 which is disposed adjacent to transfer element 22 and transfer loop T2 which is disposed adjacent to transfer element 23. The combination of transfer element 22, transfer loop T1 and the adjacent portions of paths 20 and 15 collectively describe switch S1. Similarly, transfer element 23, transfer loop T2 and the adjacent portions of paths 21 and 14 collectively form switch S2.

It should be emphasized that each of the transfer switches S1 and S2 consists of a one way transfer switch. Together the switches function as an exchange switch pair. In the instant invention, the double switch arrangement causes paths P1 and L1 to be connected in series when the switches are not activated. Conversely, paths P1 and L1 are separated from each other when switches S1 and S2 are both activated.

The switches are arranged to operate at a current level I. That is, when a current I passes through transfer loops T1 and T2, a sufficient magnetic field is generated so that switches S1 and S2 are activated. However, with correction loop C1 connected, as shown, in FIG. 1, the current I applied to conductor 10 is divided through the conductor loops C1 and CS and a current which is smaller than I is applied to loop CS. With correction loop C1 intact, switches S1 and S2 can be activated only if the current in conductor 10 is raised to $I_2 = kI$, where k is the resistance ratio between the conductor loops CS and C1. The value of k can be designed to be any value greater than 1, dependent upon the sensitivity desired in the circuit. The current $I_2$ is useful during testing as described hereinafter. In the event that correction is required, also described hereinafter, correction loop C1 can be removed by any method, such as etching, laser scribing or the like. So long as any portion of loop C1 is removed whereby loop C1 is broken, as suggested by dashed lines 30, the electrical short circuiting effect of loop C1 is removed and the current I is supplied via conductor 10 to loop CS and, thus, to transfer switches S1 and S2, respectively.

Inasmuch as current I is defined as being sufficient to cause transfer switches S1 and S2 to be active (when loop C1 is broken) bubbles propagating along path P1 from A are transferred from path 20 to path 15 via transfer element 22 and thence via merge 13 to path 21. Conversely, bubbles propagating along path 21 are transferred via transfer element 23 to path 14 and, thence, via merger 12 to path 20. These transfers occur in response to current I in conductor 10. Thus, loop L1 and path P1 are totally separate. Consequently, information propagates from location A to location B and from location D to location C.

Conversely, if correction loop C1 has not been altered (i.e. indicative of no defect in loop L1) current I in conductor 10 is split between loops C1 and CS. The resultant current (<I) through transfer loops T1 and T2 is insufficient to render switches S1 and S2 active. Consequently, information propagating along path P1 (or path 20) propagates from location A to location C. In addition, information propagating from location D propagates along path 21 to location B. Consequently, path P1 and loop L1 are connected in series.

Figure 2:
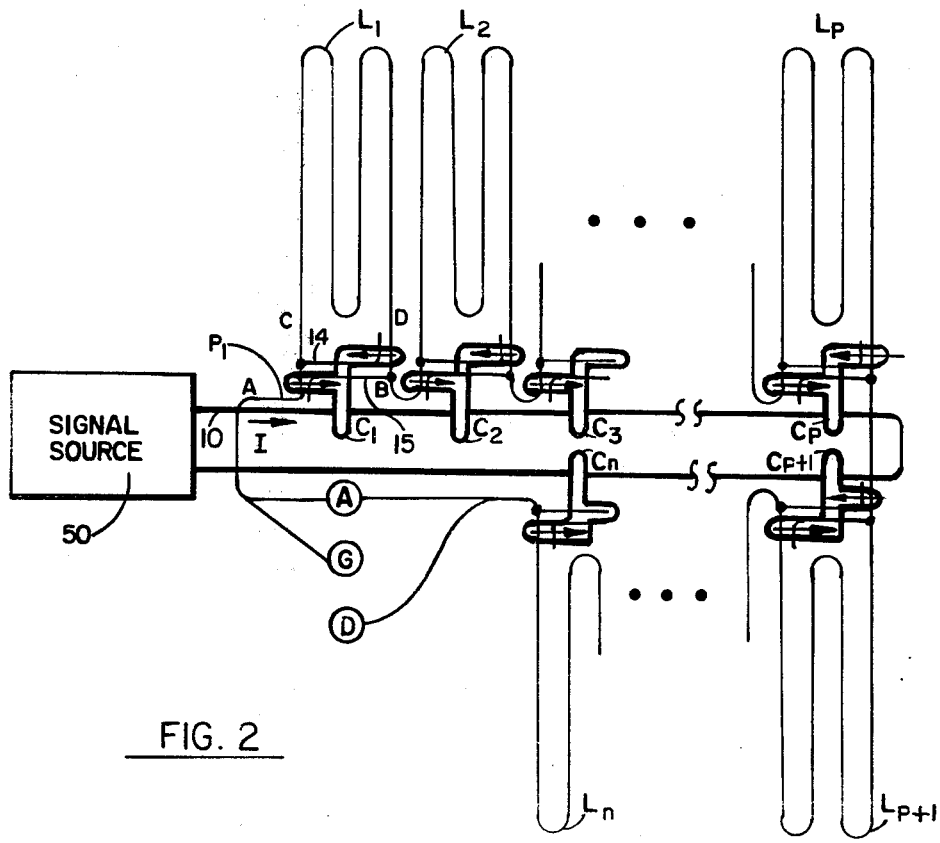
FIG. 2 is a schematic representation of a magnetic bubble domain serial memory system which incorporates the subject invention therein.

Referring now to FIG. 2, there is shown an implementation of the subject invention into a memory system. In this system, a plurality of loops L1, L2, ... LP, LP+1, ... LN are provided. Each of these loops includes a switch of the type described in FIG. 1. A major propagation path P1 is defined. Signal source 50 provides a current signal I along conductor 10. Annihilator A, generator G and detector D are shown. These elements are typical and the interaction thereof in the system is also typical and well known.

In the event that a system as shown in FIG. 2 is fabricated without any defects, a bubble generated by generator G passes through propagation path P1 and then, through loops L1, L2 and so forth through to loop LN, consecutively, wherein a large-scale series memory is provided. On the other hand, if a defect is noted in any one or more of loops L1 through LN, the defective loop is removed from the system through the simple expedient of removing the appropriate correction loop C1, C2 ... CN. As noted, above, if correction loop C1 (through CN) is not removed, current I in conductor 10 is split so that the switches S1 and S2 (see FIG. 1) are not active and the storage loop is included in the system. If the correction loop C1 (through CN) is removed, the associated switches S1 and S2 are active and the associated storage loop is removed from the circuit.

Testing for the defective minor loop such as L1, L2, and the like can be effected by applying a current I2 to the system with the appropriate information being propagated therethrough. The test procedure is typical of other testing arrangements.

Thus, there has been shown and described an improved memory system with fault tolerant capability. The full data rate is maintained on the chip even though defective loops are removed. That is, dead space is not inflicted on the information stream. The physical location of the minor loop does not affect the data structure or the data throughput and, therefore, provides more flexibility in the chip design layout. In addition, even though the minor loops are all accessed by switches, most of the switches are short circuited and only those switches corresponding to the defective or redundant loops are active. Therefore the driver requirement in this arrangement is not as critical as in prior major/minor loop chip organizations. In addition, the transfer switch line will, preferably, be pulsed in synchronism with the in-plane rotating field wherein timing control is maintained in a relatively simple manner. The large scale memory systems provided by this invention are highly desirable. Those skilled in the art will conceive of modifications to the specific details shown and described. However, any such modifications which fall within the purview of this description are intended to be included therein. That is, this description is intended to be illustrative only and not to be limitative. The scope of the application is limited only by the claims appended hereto.

Having thus described a preferred embodiment of the invention, what is claimed is:

1. A magnetic bubble domain device system comprising, first propagation path means for magnetic bubble domains, second propagation path means coupled to a first location in said first propagation path means and disposed adjacent to a second location in said first propagation path means.

third propagation path means coupled to a third location in said first propagation path means and disposed adjacent to a fourth location in said first propagation path means, and conductor means including a closed loop, a first portion of said closed loop associated with said second propagation path means and said second location in said first propagation path means, a second portion of said closed loop associated with said third propagation path means and said fourth location in said first propagation path means, a third portion of said closed loop spaced apart from all of said propagation path means.

2. The system recited in claim 1 wherein
said first and third locations in said first propagation path means comprise merge devices.

3. The system recited in claim 1 wherein
said second and fourth locations in said first propagation path means comprise transfer switch devices.

4. The system recited in claim 1 wherein
said third portion of said closed loop is selectively removed to alter the operation of the system.

5. The system recited in claim 4 wherein
said second and third propagation path means are ineffective to propagate magnetic bubbles when said third portion of said closed loop is intact, and
said second and third propagation path means propagate magnetic bubbles therealong when said third portion of said closed loop is removed.

6. The system recited in claim 1 wherein
said first propagation path means comprises an elongated path for magnetic bubble domains,
each of said second and third propagation path means selectively short circuits a portion of said first propagation path means whereby defects in said first propagation path means can be avoided.

* * * * *